United States Patent
Gupta et al.

(10) Patent No.: US 10,615,587 B2
(45) Date of Patent: Apr. 7, 2020

(54) BIPOLAR DC POWER TRANSMISSION SCHEME

(71) Applicant: General Electric Technology GmbH, Baden (CH)

(72) Inventors: Robin Gupta, Stafford (GB); Robert Stephen Whitehouse, Stafford (GB); Carl David Barker, Stone (GB); Andrzej Adamczyk, Stafford (GB)

(73) Assignee: General Electric Technology GmbH, Baden (CH)

( * ) Notice: Subject to any disclaimer, the term of this patent is extended or adjusted under 35 U.S.C. 154(b) by 337 days.

(21) Appl. No.: 15/570,161

(22) PCT Filed: Apr. 27, 2016

(86) PCT No.: PCT/EP2016/059442
§ 371 (c)(1),
(2) Date: Oct. 27, 2017

(87) PCT Pub. No.: WO2016/174109
PCT Pub. Date: Nov. 3, 2016

(65) Prior Publication Data
US 2018/0145499 A1    May 24, 2018

(30) Foreign Application Priority Data

Apr. 28, 2015    (GB) .................................. 1507180.6

(51) Int. Cl.
*H02H 3/16*    (2006.01)
*H02J 3/36*    (2006.01)
(Continued)

(52) U.S. Cl.
CPC ............... *H02H 3/16* (2013.01); *G01R 19/12* (2013.01); *H02H 1/0007* (2013.01);
(Continued)

(58) Field of Classification Search
CPC .......... H02H 3/16; H02H 3/063; H02H 7/268; H02H 7/265; H02H 1/0007; H02J 3/36;
(Continued)

(56) References Cited

U.S. PATENT DOCUMENTS

2013/0229739 A1    9/2013  Juhlin
2015/0015066 A1    1/2015  Dong et al.
(Continued)

FOREIGN PATENT DOCUMENTS

EP    2 830 200 A1    1/2015
GB    2 537 850 A     11/2016
(Continued)

OTHER PUBLICATIONS

Bahrman and Johnson, "The ABCs of HVDC transmission technologies," IEEE Power and Energy Magazine, vol. 5, No. 2, pp. 32-44, (Mar. 2007).
(Continued)

*Primary Examiner* — Kevin J Comber
(74) *Attorney, Agent, or Firm* — Eversheds Sutherland (US) LLP

(57) ABSTRACT

A bipolar DC power transmission scheme including first and second DC poles, each including a respective DC power transmission medium extending between first and second ends; a plurality of converters wherein each end of the transmission medium of each of the poles is operatively connected to at least one of the converters to form a rectifier and an inverter at opposite ends of the DC power transmission media; and a controller to operate at least one converter of one of the rectifier and inverter in a control mode and at least one converter of the other of the rectifier and inverter in a second control mode in response to a fault occurring on either of the poles. Additionally, the first control mode decreases and the second control mode increases the oper-
(Continued)

ating DC voltage of the or each corresponding converter from a normal operating voltage value.

16 Claims, 8 Drawing Sheets

(51) Int. Cl.
*H02H 7/26* (2006.01)
*G01R 19/12* (2006.01)
*H02H 1/00* (2006.01)
*H02M 7/757* (2006.01)
*H02M 7/483* (2007.01)
*H02H 3/06* (2006.01)
*H02M 5/458* (2006.01)

(52) U.S. Cl.
CPC ............ *H02H 7/265* (2013.01); *H02H 7/268* (2013.01); *H02J 3/36* (2013.01); *H02H 3/063* (2013.01); *H02M 5/458* (2013.01); *H02M 7/7575* (2013.01); *H02M 2007/4835* (2013.01); *Y02E 60/60* (2013.01)

(58) Field of Classification Search
CPC .... G01R 19/12; H02M 5/458; H02M 7/7575; H02M 2007/4835; Y02E 60/60
USPC .......................................................... 361/47
See application file for complete search history.

(56) References Cited

U.S. PATENT DOCUMENTS

2015/0070802 A1    3/2015  Dong et al.
2015/0145252 A1*   5/2015  Lin ...................... H02M 7/145
                                                    290/44

FOREIGN PATENT DOCUMENTS

WO    2013/174726 A1    11/2013
WO    2014/121438 A1     8/2014

OTHER PUBLICATIONS

Merlin et al., "A New Hybrid Multi-level Voltage-Sourced Converter with DC Fault Blocking Capability," 9th IET International Conference on AC and DC Power Transmission, pp. 1-5, (Oct. 2010).

Whitehouse, "Technical challenges of realising multi-terminal Networking with VSC," Proceedings of the 2011—14th European Conference on Power Electronics and Applications (EPE 2011), pp. 1-12, (Sep. 2011).

Combined Search and Examination Report issued in connection with corresponding GB Application No. 1507180.6 dated Nov. 6, 2015.

International Search Report and Written Opinion issued in connection with corresponding PCT Application PCT/EP2016/059442 dated Aug. 11, 2016.

International Preliminary Report on Patentabiltiy issued in connection with corresponding PCT Application PCT/EP2016/059442 dated Nov. 9, 2017.

* cited by examiner

BIPOLAR DC POWER TRANSMISSION SCHEME

BACKGROUND OF THE INVENTION

Embodiments of the invention relate to a bipolar DC power transmission scheme and a method of operating a bipolar DC power transmission scheme.

It is known to use a bipolar DC power transmission scheme to transmit power at high voltage levels over long distances.

BRIEF DESCRIPTION OF THE INVENTION

According to a first aspect of the invention, there is provided a bipolar DC power transmission scheme comprising: first and second DC poles, each DC pole including a respective DC power transmission medium extending between first and second ends. Additionally, a plurality of converters, wherein each end of the DC power transmission medium of each of the first and second DC poles is respectively operatively connected to at least one of the plurality of converters to form a rectifier at the first ends of the DC power transmission media and an inverter at the second ends of the DC power transmission media; and a controller programmed to operate at least one converter of one of the rectifier and inverter in a first control mode and at least one converter of the other of the rectifier and inverter in a second control mode in response to a fault occurring on either of the first and second DC poles so as to oppose a resultant change in current in the healthy other of the first and second DC poles on which the fault has not occurred; wherein the first control mode includes decreasing the operating DC voltage of the or each corresponding converter from a normal operating voltage value, and wherein the second control mode includes increasing the operating DC voltage of the or each corresponding converter from a normal operating voltage value.

The conventional response to a fault on a DC pole of a bipolar DC power transmission scheme involves blocking the converters connected to the faulty DC pole and tripping associated AC circuit breakers to clear the faulty DC pole. Although the healthy DC pole is normally expected to be unaffected by the fault and thereby able to continue transmitting power, the inventors have found that the mutual coupling between the faulty and healthy DC poles may result in strong dynamics in the converters connected to the healthy DC pole that leads to a change in converter current, which not only interferes with the power transmission operation but also increases the risk of damage to the converters connected to the healthy DC pole.

The inclusion of the controller in the bipolar DC power transmission device of embodiments of the invention enables operation of the converters in the first and second control modes to oppose the resultant change in current in the healthy DC pole that arises from the mutual coupling between the faulty and healthy DC poles, and thereby allows the operation of the converters connected to the healthy DC pole within safe operating limits whilst facilitating an acceptable level of power transmission in the event of the fault.

Each DC power transmission medium may be any medium that is capable of transmitting electrical power between two or more converters. Such a medium may be, but is not limited to, a submarine DC power transmission cable, an overhead DC power transmission line or cable and an underground DC power transmission cable.

It will be appreciated that the configuration of the controller may vary depending on specific requirements of the bipolar DC power transmission scheme. For example, the controller may include a global control unit for controlling a plurality of converters, at least one local control unit for controlling at least one converter, or a combination thereof. The global control unit may be located remotely from each converter and may be configured to communicate with each converter via telecommunications links. The or each local control unit may be located in the vicinity of at least one converter. The global control unit may be configured to communicate with at least one local control unit via telecommunications links. When the controller includes a plurality of control units, the control units in combination may form a control system.

The first control mode may include decreasing the operating DC voltage of the or each corresponding converter from a normal operating voltage value to a minimum allowable voltage value and/or the second control mode may include increasing the operating DC voltage of the or each corresponding converter from a normal operating voltage value to a maximum allowable voltage value. This enables the operation of the corresponding converters to maximise the opposition to the resultant change in current in the healthy DC pole that arises from the mutual coupling between the faulty and healthy DC poles.

The magnitudes of the maximum and minimum allowable voltage values may vary depending on the design and requirements of the bipolar DC power transmission scheme. For example, the maximum allowable voltage value may be 1.0 per unit and/or the minimum allowable voltage value may be limited by the peak magnitude of an AC side voltage of the corresponding converter.

For certain locations of the fault along the faulty pole, the mutual coupling between the faulty and healthy DC poles may result in an overcurrent in the converters connected to the healthy DC pole that not only interferes with the power transmission operation but also increases the risk of damage to the converters connected to the healthy DC pole.

After the occurrence of the fault, the converters connected to the faulty DC pole may experience an overcurrent, and the converters connected to the healthy DC pole may also experience an overcurrent due to the mutual coupling between the faulty and healthy DC poles.

In embodiments of the invention, the controller may be programmed to operate the at least one converter of the rectifier in the first control mode and the at least one converter of the inverter in the second control mode in response to a converter current of at least one of the converters exceeding a first overcurrent threshold, which may be 1.05 per unit. Programming the controller in this manner provides a reliable means of initiating the first and second control modes in response to a fault occurring on either of the first and second DC poles that results in an overcurrent in the converters connected to the healthy DC pole.

In such embodiments of the invention, the bipolar DC power transmission scheme may further include a plurality of circuit interruption devices, each circuit interruption device arranged to be selectively operable to clear a respective one of the DC power transmission media, wherein the controller is programmed to block each converter with a converter current that exceeds a second overcurrent threshold and to send an open command to the or each corresponding circuit interruption device to clear the DC power transmission medium corresponding to the faulty one of the first and second DC poles on which the fault has occurred, wherein the second overcurrent threshold is higher than the first overcurrent threshold. The second overcurrent threshold may be designed to correspond to a safety current threshold of each converter. Each circuit interruption device may be, for example, an AC circuit breaker.

The provision of the circuit interruption devices in the bipolar DC power transmission scheme obviates the need for a monitoring device or monitoring system to identify the faulty DC pole to enable the operation of the converters in the first and second control modes to oppose the resultant change in current in the healthy DC pole. It will be appreciated that the second overcurrent threshold may be designed so that, when each converter connected to the faulty DC pole is subjected to an overcurrent that exceeds the second overcurrent threshold, each converter connected to the healthy DC pole will not be subjected to an overcurrent that exceeds the second overcurrent threshold.

In further embodiments of the invention, the bipolar DC power transmission scheme may further include a first monitoring device configured to identify the one of the first and second DC poles on which the fault has occurred, wherein the at least one converter of the one of the rectifier and inverter operated in the first control mode and the at least one converter of the other of the rectifier and inverter operated in the second control mode is operatively connected to the healthy other of the first and second DC poles on which the fault has not occurred.

It will be appreciated that embodiments of the invention may include a single first monitoring device or a plurality of first monitoring devices.

The inclusion of the monitoring device in the bipolar DC power transmission scheme enables the controller to selectively operate the converters connected to the healthy DC pole in the first and second control modes, without having to operate the converters connected to the faulty DC pole in the first and second control modes.

In such embodiments, the bipolar DC power transmission scheme may further include a plurality of circuit interruption devices, each circuit interruption device arranged to be selectively operable to clear a respective one of the DC power transmission media, wherein the controller is programmed to block each converter connected to the identified faulty one of the first and second DC poles on which the fault has occurred and to send an open command to the or each corresponding circuit interruption device to clear the DC power transmission medium corresponding to the faulty one of the first and second DC poles on which the fault has occurred.

The monitoring device may be configured in a variety of ways to identify the faulty one of the first and second DC poles on which the fault has occurred. For example, the monitoring device may be configured to identify the faulty one of the first and second DC poles on which the fault has occurred by one or more of: wherein the bipolar DC power transmission scheme includes a current return path, monitoring the direction of current in the current return path; monitoring the reflection of one or more travelling waves in each DC power transmission medium; monitoring the rate of rise of converter current of at least one of the plurality of converters; monitoring the magnitude of converter current of at least one of the plurality of converters.

The monitoring device may include, for example, one or more current sensors and/or one or more voltage sensors.

In still further embodiments of the invention, the controller may be programmed to operate each converter operated in the respective one of the first and second control modes and connected to the healthy one of the first and second DC poles on which the fault has not occurred so as to operate in a third control mode subsequent to its operation in the respective one of the first and second control modes, the third control mode including restoring the operating DC voltage of the or each corresponding converter to a normal operating voltage value. This permits the bipolar DC power transmission scheme to resume power transmission.

In such embodiments of the invention employing the use of the third control mode, the initiation of the third control mode may be triggered upon one or more conditions being met. For example, the controller may be programmed to operate each converter operated in the respective one of the first and second control modes and connected to the healthy one of the first and second DC poles on which the fault has not occurred so as to operate in the third control mode when one or more of the following conditions are met: decrease of the converter current in each corresponding converter below a third overcurrent threshold, which may be 1.005 per unit; lapse of a time delay after the operation of each corresponding converter in the respective one of the first and second control modes; lapse of a time delay after the decrease of the converter current in each corresponding converter below a fourth overcurrent threshold, which may be equal to the third overcurrent threshold.

The mutual coupling between the faulty and healthy DC poles may result in an undercurrent in the converters connected to the healthy DC pole that results in a reduction in transmitted DC power in the healthy DC pole.

In embodiments of the invention, the controller may be programmed to operate the at least one converter of the inverter in the first control mode and the at least one converter of the rectifier in the second control mode in response to a converter current of at least one of the converters connected to the healthy one of the first and second DC poles on which the fault has not occurred dropping below an undercurrent threshold. Programming the controller in this manner provides a reliable means of initiating the first and second control modes in response to a fault occurring on either of the first and second DC poles that results in an undercurrent in one or more of the converters connected to the healthy DC pole.

In such embodiments of the invention, the bipolar DC power transmission scheme may further include a second monitoring device configured to detect the occurrence of the fault in either of the first and second DC poles, wherein the controller is programmed to operate the at least one converter of the inverter in the first control mode and the at least one converter of the rectifier in the second control mode in response to the detection of the occurrence of the fault in either of the first and second DC poles. This enables the controller to differentiate between an undercurrent resulting from a fault occurring in either of the first and second DC poles and an undercurrent resulting from other events, such as a fault on the AC side of a given converter, and hence only initiate the first and second control modes in respect of the occurrence of the fault in either of the first and second DC poles.

It will be appreciated that embodiments of the invention may include a single second monitoring device or a plurality of second monitoring devices.

The plurality of monitoring devices in combination may form a monitoring system.

The or each monitoring device may be formed integrally with or separately from the controller. In particular the or each monitoring device may be formed integrally with a global or local control unit of the controller.

It will be appreciated the first and second monitoring devices may be the same monitoring device or may be separate monitoring devices.

In further such embodiments employing the use of the third control mode, the controller may be programmed to operate each converter operated in the respective one of the first and second control modes so as to operate in the third control mode when the converter current in each corresponding converter returns to a normal operating current value. As mentioned above, the use of the third control mode permits the bipolar DC power transmission scheme to resume power transmission.

The fault may be, but is not limited to, a pole-to-ground fault.

Each of the plurality of converters may vary in topology.

At least one of the plurality of converters may include at least one module. The or each module may include at least one switching element and at least one energy storage device. The or each switching element and the or each energy storage device in the or each module may be arranged to be combinable to selectively provide a voltage source.

The or each converter may include a plurality of modules to define a chain-link converter.

The structure of the chain-link converter (which may, for example, comprise a plurality of series-connected modules) permits build-up of a combined voltage across the chain-link converter, which is higher than the voltage available from each of its individual modules, via the insertion of the energy storage devices of multiple modules, each providing its own voltage, into the chain-link converter. In this manner the chain-link converter is capable of providing a stepped variable voltage source, which permits the generation of a voltage waveform across the chain-link converter using a step-wise approximation. As such the chain-link converter is capable of providing a range of complex voltage waveforms.

The or each module may vary in structure. For example, the or each module may include a pair of switching elements connected in parallel with an energy storage device in a half-bridge arrangement to define a 2-quadrant unipolar module that can provide zero or positive voltages and can conduct current in two directions.

According to a second aspect of the invention, there is provided a method of operating a bipolar DC power transmission scheme, the bipolar DC power transmission scheme including first and second DC poles, each DC pole including a respective DC power transmission medium extending between first and second ends, the bipolar power transmission scheme further including a plurality of converters, wherein each end of the DC power transmission medium of each of the first and second DC poles is respectively operatively connected to at least one of the plurality of converters to form a rectifier at the first ends of the DC power transmission media and an inverter at the second ends of the DC power transmission media, the method comprising the steps of: operating at least one converter of the rectifier in a first control mode and operating at least one converter of the inverter in a second control mode in response to a fault occurring on either of the first and second DC poles so as to oppose a resultant change in current in the healthy other of the first and second DC poles on which the fault has not occurred, wherein the first control mode includes decreasing the operating DC voltage of the or each corresponding converter from a normal operating voltage value and wherein the second control mode includes increasing the operating DC voltage of the or each corresponding converter from a normal operating voltage value.

The features and advantages of the bipolar DC power transmission scheme of the first aspect of the invention and its embodiments apply mutatis mutandis to the method of the second aspect of the invention.

It will be appreciated that the use of the terms "first" and "second" in the patent specification is merely intended to help distinguish between similar features (e.g. the first and second DC poles), and is not intended to indicate the relative importance of one feature over another feature.

BRIEF DESCRIPTION OF THE DRAWINGS

Embodiments of the invention will now be described, by way of a non-limiting example, with reference to the accompanying drawings in which.

DETAILED DESCRIPTION

Figure 1A:
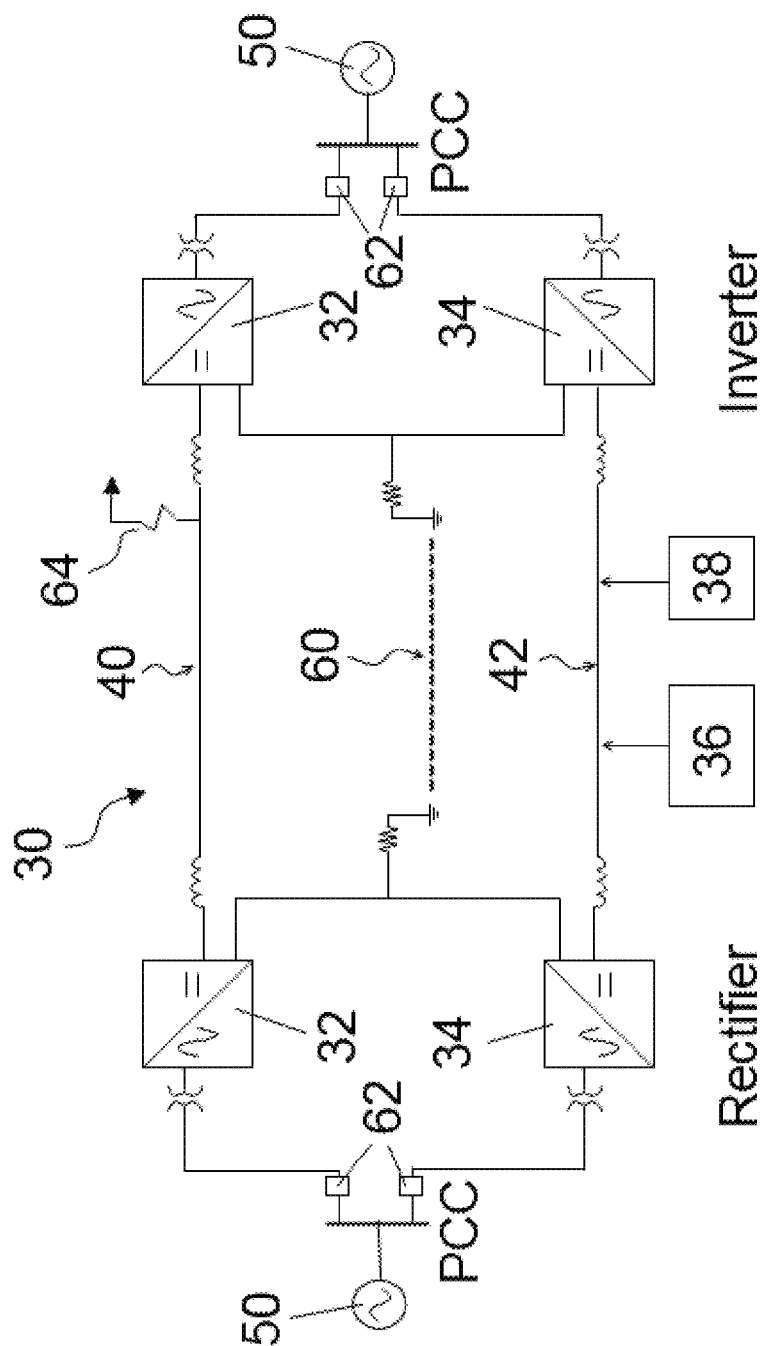
FIGS. 1A and 1B show schematically the layout of a bipolar DC power transmission scheme.
Figure 1B:
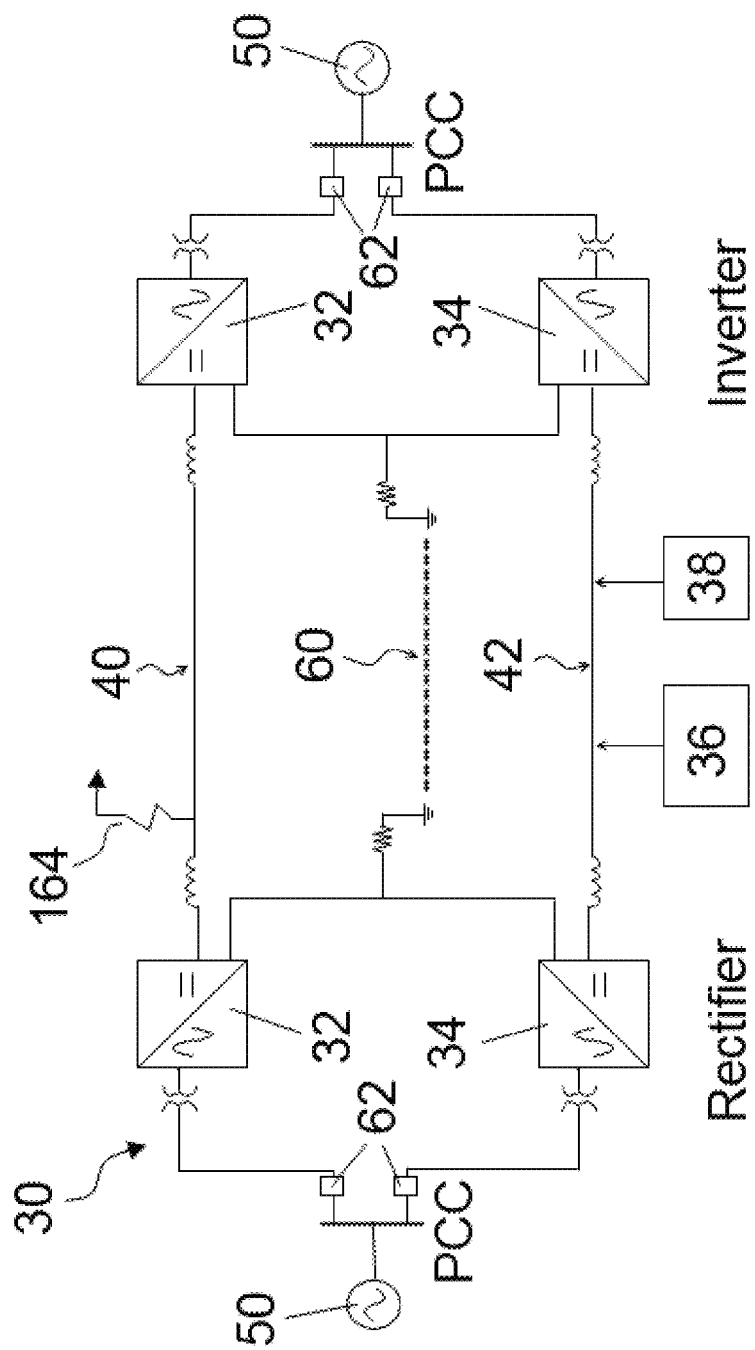

A bipolar DC power transmission scheme according to an embodiment of the invention is shown in FIGS. 1A and 1B and is designated generally by the reference numeral 30.

The bipolar DC power transmission scheme 30 comprises first and second DC poles, a plurality of first converters 32, a plurality of second converters 34, a controller 36 and a monitoring device 38.

The first DC pole includes a first DC power transmission line 40 extending between first and second ends. The second DC pole includes a second DC power transmission line 42 extending between first and second ends.

Figure 2:
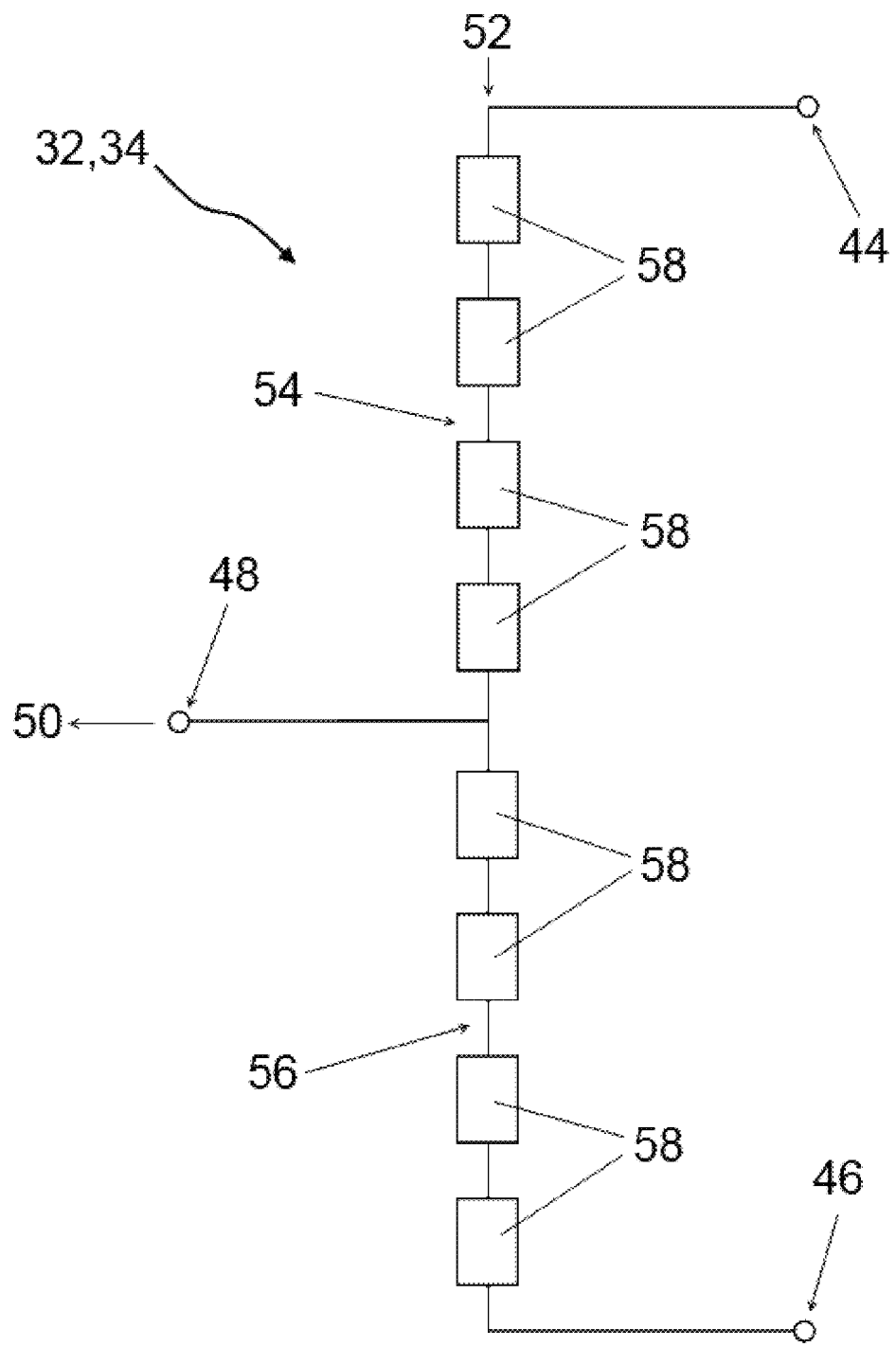
FIG. 2 shows schematically the structure of a converter of the bipolar power transmission scheme of FIGS. 1A and 1B.

Each converter 32,34 includes a first DC terminal 44 and a second DC terminal 46. In addition each converter 32,34 shown in FIGS. 1A and 1B includes a plurality of AC terminals 48, each of which in use is connected to a respective phase of a respective multi-phase AC network 50. More particularly, each converter 32,34 shown in FIGS. 1A and 1B defines an AC/DC voltage source converter 32,34 which includes a plurality of converter limbs 52, each of which is arranged as shown in FIG. 2.

Each converter limb 52 extends between the first and second DC terminals 44,46, and includes a first limb portion 54 that extends between the first DC terminal 44 and the AC terminal 48, and a second limb portion 56 which extends between the second DC terminal 46 and the AC terminal 48.

Figure 3:
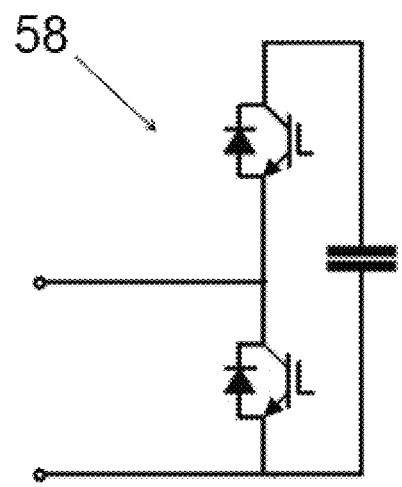
FIG. 3 shows schematically the structure of a module of the converter of FIG. 2.

Each limb portion 56,58 includes a plurality of series-connected modules 58 to define a chain-link converter. In the specific embodiment shown, each module 58 includes a pair of switching elements that are connected in parallel with a capacitor in a half-bridge arrangement to define a 2-quadrant unipolar module 58 that can provide zero or positive voltages and can conduct current in two directions, as shown in FIG. 3.

Each switching element constitutes an insulated gate bipolar transistor (IGBT), which is connected in parallel with an anti-parallel passive current check element in the form of a diode.

It is envisaged that, in other embodiments of the invention, the IGBT may be replaced by one or more other semiconductor switches, the diode may be replaced by another type of passive current check element that limits current flow to only one direction, and/or each capacitor may be replaced by another type of energy storage device that is capable of storing and releasing energy, e.g. a fuel cell or battery.

It will be appreciated that the topology of each converter 32,34 is merely chosen to help illustrate the operation of the invention, and that each converter 32,34 may be replaced by another converter with a different topology.

The first end of the first DC power transmission line 40 is operatively connected to the first DC terminal 44 of one of the plurality of first converters 32, and the second end of the first DC power transmission line 40 is operatively connected to the first DC terminal 44 of another of the plurality of first converters 32. The first end of the second DC power transmission line 42 is operatively connected to the first DC terminal 44 of one of the plurality of second converters 34, and the second end of the second DC power transmission line 42 is operatively connected to the first DC terminal 44 of another of the plurality of second converters 34.

As shown in FIGS. 1A and 1B, the converters 32,34 operatively connected to the first ends of the DC power transmission lines 40,42 form a rectifier that is depicted by the converters 32,34 on the left side of FIGS. 1A and 1B, and the converters 32,34 operatively connected to the second ends of the DC power transmission lines 40,42 form an inverter that is depicted by the converters 32,34 on the right side of FIGS. 1A and 1B.

The second DC terminals 46 of the converters 32,34 of the rectifier are operatively connected via a current return path 60 to the second DC terminals 46 of the converters 32,34 of the inverter. The current return path 60 may be an electrode line or a metallic return. It will be appreciated that the current return path 60 is optional.

The bipolar DC power transmission scheme 30 further includes a plurality of AC circuit breakers 62. Each AC circuit breaker 62 is connected at an AC side of each converter 32,34. In this manner each AC circuit breaker 62 is arranged to be selectively operable to clear the corresponding DC power transmission line 40,42.

The controller 36 is programmed to control the switching of the switching elements of the modules 58 of each converter 32,34 in order to operate each module 58 to selectively provide a voltage source. This enables the controller 36 to modify the operating DC voltage of each converter 32,34.

The controller 36 is further programmed to selectively send an open command to each AC circuit breaker 62 to clear the corresponding DC power transmission line 40,42.

The configuration of the controller 36 may vary depending on specific requirements of the bipolar DC power transmission scheme 30. For example, the controller 36 may include a global control unit for controlling a plurality of converters 32,34, at least one local control unit for controlling at least one converter 32,34, or a combination thereof. The global control unit may be located remotely from each converter 32,34 and may be configured to communicate with each converter 32,34 via telecommunications links. The or each local control unit may be located in the vicinity of at least one converter 32,34. The global control unit may be configured to communicate with at least one local control unit via telecommunications links.

During normal operation of the bipolar DC power transmission scheme 30, the controller 36 controls the switching of the switching elements of the modules 58 of each converter 32,34 in order to operate each converter 32,34 to perform a power conversion operation to transfer power between its AC and DC terminals 50,44,46. Such operation results in the transmission of power between the multi-phase AC networks 50, which includes the transmission of power along the DC power transmission lines 40,42 between the converters 32,34.

One of the first and second DC power transmission lines 40,42 may experience a DC pole-to-ground fault 64,164 during the operation of the bipolar DC power transmission scheme 30. It is desirable for the healthy DC pole to continue transmitting power using the current return path 60 during the DC pole-to-ground fault 64,164. This can be normally achieved through the conventional response which includes blocking of the converters 32,34 connected to the faulty DC pole and tripping the associated AC circuit breakers 62 to clear the faulty DC pole.

For each converter 32,34 connected to the faulty DC pole, the DC pole to ground fault 64,164 on one DC pole has the effect of a DC pole-to-DC pole fault. This results in the flow of a heavy fault current with a high rate of rise of current.

The use of the IGBT and anti-parallel diode pairs in each half-bridge module 58 means that each converter 32,34 connected to the faulty DC pole is unable to prevent the fault current from flowing from the corresponding AC network 50, through the diodes of the half-bridge modules 58 of the converter and to the fault 64. This results in a voltage drop of the point of common coupling connected to the AC side of each converter 32,34 connected to the faulty DC pole until the corresponding AC circuit breaker 62 is opened, which typically takes 2-3 cycles to take place.

The mutual coupling between the faulty and healthy DC poles may result in strong dynamics in the converters 32,34 connected to the healthy DC pole that leads to a change in current in the healthy DC pole. For example, the high rate of rise of current in the faulty DC pole may induce a corresponding voltage in the healthy DC pole, thus resulting in heavy transients in the healthy DC pole.

Depending on the location of the fault in the faulty DC pole, the mutual coupling effect may results in an overcurrent in each converter 32,34 connected to the healthy DC pole, which in turn could lead to an overvoltage of the capacitor of each corresponding module 58. In addition the increase in current transient in the healthy DC pole may inadvertently trigger an overcurrent protection scheme 30 to take effect. Moreover, if the voltage level of the capacitor of each module 58 continues to stay above a safety voltage limit, it may not be possible to safely discharge the capacitor, for example using discharge resistors.

Also, depending on the location of the fault in the faulty DC pole, the mutual coupling effect may results in an undercurrent in each converter 32,34 connected to the healthy DC pole, which reduces the transmitted DC power in the healthy DC pole.

A method of operating the bipolar power transmission scheme 30 of FIGS. 1A and 1B is described as follows.

For the purposes of illustrating the working an embodiment of the invention, it is assumed that the pole-to-ground fault 64,164 occurs on the first DC pole, but it will be understood that the following description applies mutatis mutandis to the occurrence of the DC pole-to-ground fault 64,164 on the second DC pole.

As shown in FIG. 1A, the location of the pole-to-ground fault 64 may be closer to the second end of the first DC power transmission line 40 than to the first end of the DC power transmission line 40. This results in an overcurrent in each converter 34 connected to the healthy, second DC pole.

In response to the occurrence of the pole-to-ground fault 64 in the first DC pole, the controller 36 operates the converters 32,34 of the rectifier in a first control mode and the converters 32,34 of the inverter in a second control mode. This is achieved by designing the controller 36 to initiate the first and second control modes in response to a converter current of at least one of the converters 32,34 exceeding a first overcurrent threshold, which may be 1.05 per unit.

The first control mode includes decreasing the operating DC voltage of each corresponding converter 32,34 from a normal operating voltage value to a minimum allowable voltage value, which may be limited by the peak magnitude of an AC side voltage of the corresponding converter 32,34. The second control mode includes increasing the operating DC voltage of each corresponding converter 32,34 from a normal operating voltage value to a maximum allowable voltage value, which may be 1.0 per unit.

Operating the converters 32,34 in the first and second control modes has the effect of enabling the converters 34 connected to the healthy DC pole to oppose the resultant increase in current in the healthy DC pole that arises from the mutual coupling between the faulty and healthy DC poles, and thereby allows the operation of the converters 34 connected to the healthy DC pole within safe operating limits whilst facilitating an acceptable level of power transmission in the event of the pole-to-ground fault 64.

During the performance of the first and second control modes, when the converter current in the converters 32 connected to the faulty DC pole exceeds a second overcurrent threshold (e.g. 1.2 per unit) that is higher than the first overcurrent threshold, the controller 36 blocks the converters 32 connected to the faulty DC pole and sends an open command to the corresponding AC circuit breakers 62 to clear the faulty DC pole. This thereby obviates the need to identify the faulty DC pole in order to enable the operation of the converters 32,34 in the first and second control modes to oppose the resultant change in current in the healthy DC pole. The second overcurrent threshold is, in an embodiment, designed so that, when each converter 32 connected to the faulty DC pole is subjected to an overcurrent that exceeds the second overcurrent threshold, each converter 34 connected to the healthy DC pole will not be subjected to an overcurrent that exceeds the second overcurrent threshold.

Additionally or alternatively, the monitoring device 38 may be configured to identify the faulty one of the first and second DC poles on which the fault 64 has occurred. In this regard the monitoring device 38 is configured to include one or more suitable sensors (e.g. current and/or voltage sensors) to identify the faulty DC pole through one or more of: monitoring the direction of current in the current return path 60; monitoring the reflection of one or more travelling waves in each DC power transmission line 40,42; monitoring the rate of rise of converter current of at least one of the plurality of converters 32,34; monitoring the magnitude of converter current of at least one of the plurality of converters 32,34.

The faulty DC pole can be identified by monitoring the direction of current in the current return path 60, because the direction of fault current for when the first DC pole is the faulty pole will be opposite to the direction of fault current for when the second DC pole is the faulty pole. Once the faulty DC pole is identified, the controller 36 then selectively operates the converters 34 connected to the healthy DC pole in the first and second control modes, blocks the converters 32 connected to the faulty DC pole and sends an open command to the corresponding AC circuit breakers 62 to clear the faulty DC pole.

Subsequent to the performance of the first and second control modes, the controller 36 operates each converter 34 operated in the respective one of the first and second control modes and connected to the healthy DC pole so as to operate in a third control mode. The third control mode includes restoring the operating DC voltage of each corresponding converter 34 connected to the healthy DC pole to the normal operating voltage value. This permits the bipolar DC power transmission scheme 30 to resume its normal power transmission operation.

The initiation of the third control mode may be triggered upon one or more conditions being met. For example, the controller 36 may be programmed to operate each converter 34 operated in the respective one of the first and second control modes and connected to the healthy DC pole so as to operate in the third control mode when one or more of the following conditions are met: decrease of the converter current in each corresponding converter 34 below a third overcurrent threshold, which may be 1.005 per unit; lapse of a time delay after the operation of each corresponding converter, 34 in the respective one of the first and second control modes; lapse of a time delay after the decrease of the converter current in each corresponding converter 34 below a fourth overcurrent threshold, which may be equal to the third overcurrent threshold.

As shown in FIG. 1B, the location of the pole-to-ground fault 164 may be closer to the first end of the first DC power transmission line 40 than to the second end of the DC power transmission line 40. This results in an undercurrent in each converter 34 connected to the healthy, second DC pole.

In response to the occurrence of the pole-to-ground fault 164, the controller 36 operates the converters 34 of the inverter connected to the healthy DC pole in the first control mode and the converters 34 of the rectifier connected to the healthy DC pole in the second control mode. This is achieved by designing the controller 36 to initiate the first and second control modes in response to a converter current of at least one of the converters 34 connected to the healthy DC pole dropping below an undercurrent threshold.

In an embodiment, the monitoring device is configured to detect the occurrence of the fault 164 in the first DC pole. This enables the controller 36 to differentiate between an undercurrent resulting from the fault 164 occurring in the first DC pole and an undercurrent resulting from other events, such as a fault on the AC side of a given converter 34 connected to the healthy DC pole. In response to the detection of the occurrence of the fault 164 in the first DC pole, the controller 36 operates the converter 34 of the inverter connected to the healthy DC pole in the first control mode and the converter 34 of the rectifier connected to the healthy DC pole in the second control mode.

Subsequent to the performance of the first and second control modes, the controller 36 operates each converter 34 operated in the respective one of the first and second control modes and connected to the healthy DC pole so as to operate in the third control mode. The third control mode includes restoring the operating DC voltage of each corresponding converter 34 to the normal operating voltage value when the converter current in each corresponding converter 34 returns to a normal operating current value. As mentioned above, the use of the third control mode permits the bipolar DC power transmission scheme 30 to resume power transmission.

Operating the converters 34 connected to the healthy DC pole in the first and second control modes has the effect of enabling the converters 34 connected to the healthy DC pole to oppose the resultant decrease in current in the healthy DC pole that arises from the mutual coupling between the faulty and healthy DC poles, and thereby allows the operation of the converters 34 connected to the healthy DC pole at an acceptable level of power transmission in the event of the DC pole-to-ground fault 164.

FIGS. 4A to 7B compares, in graphical form, the variations in electrical characteristics of the converters 34 connected to the healthy DC pole when (a) no changes are applied to the control of the second converters 34 connected to the healthy DC pole, and (b) the above-described method is applied. In each of FIGS. 4a to 7B, the fault 64,164 is applied at t=2 seconds.

Figure 4A:
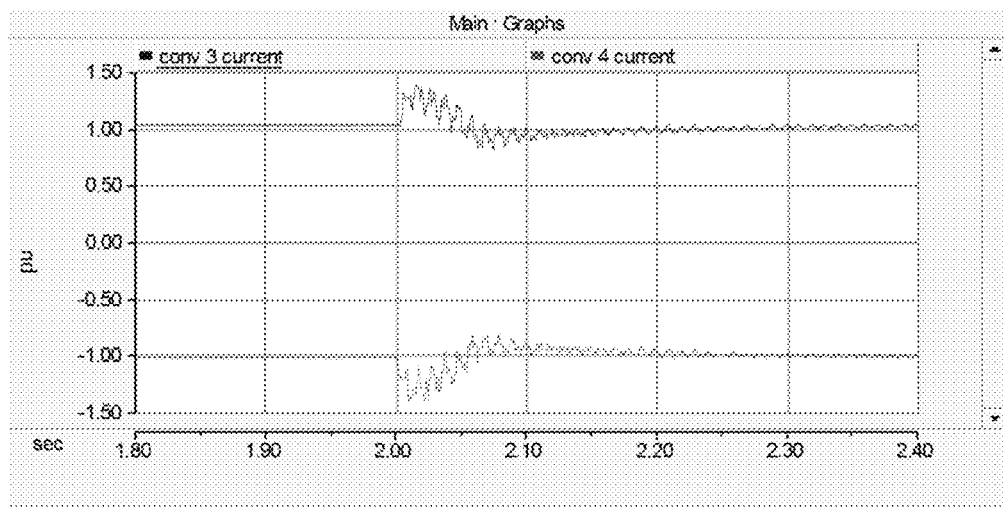
FIGS. 4A, 4B, 5A, 5B, 6A, 6B, 7A and 7B compares, in graphical form, the variations in electrical characteristics of converters connected to a healthy DC pole when no changes are applied to the control of the converters and when the method is applied.
Figure 4B:
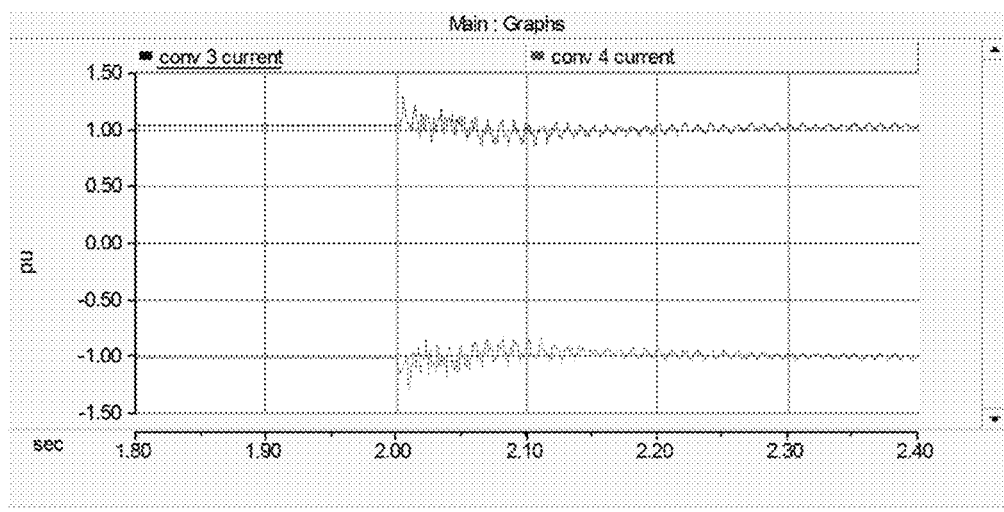

FIGS. 4A and 4B compares, in graphical form, the variations in converter current of the second converters 34 connected to the healthy DC pole when (a) no changes are applied to the control of the second converters 34 connected to the healthy DC pole, as shown in FIG. 4a, and (b) the above-described method is applied, as shown in FIG. 4B. It can be seen that the application of the method results in a smaller current transient in the second converters 34 connected to the healthy DC pole when compared to the method in which no changes are applied to the control of the second converters 34 connected to the healthy DC pole after the fault 64,164 occurs.

Figure 5A:
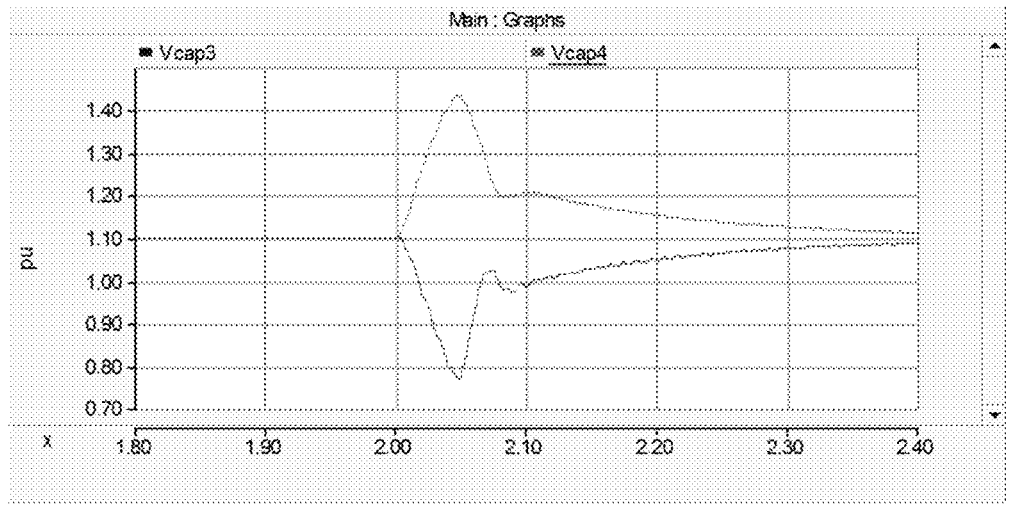
Figure 5B:
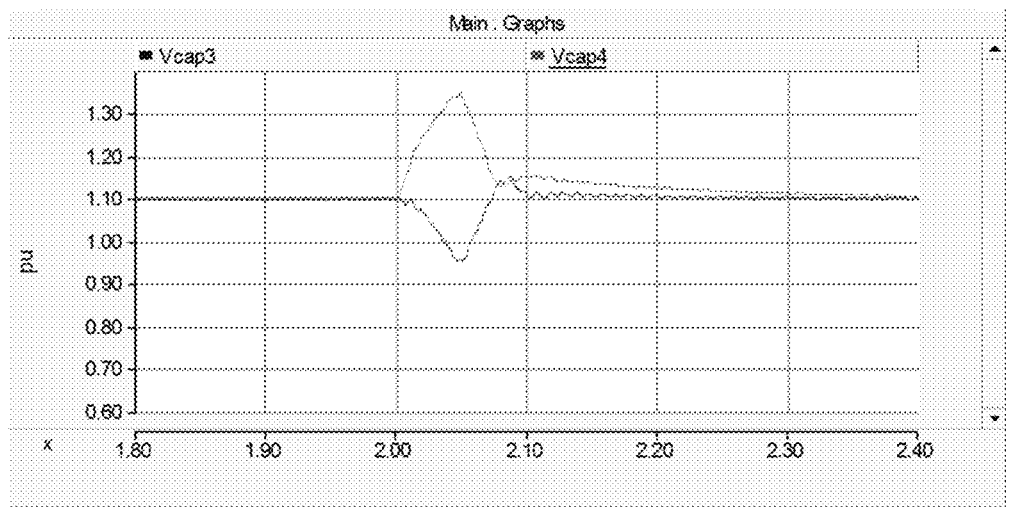

FIGS. 5A and 5B compares, in graphical form, the variations in voltage of the capacitors of the modules 58 of the second converters 34 connected to the healthy DC pole when (a) no changes are applied to the control of the second converters 34 connected to the healthy DC pole, as shown in FIG. 5A, and (b) the above-described method is applied, as shown in FIG. 5B. It can be seen that the application of the method results in a smaller increase in voltage of the capacitors of the modules 58 of the second converters 34 connected to the healthy DC pole when compared to the method in which no changes are applied to the control of the second converters 34 connected to the healthy DC pole after the fault 64,164 occurs.

Figure 6A:
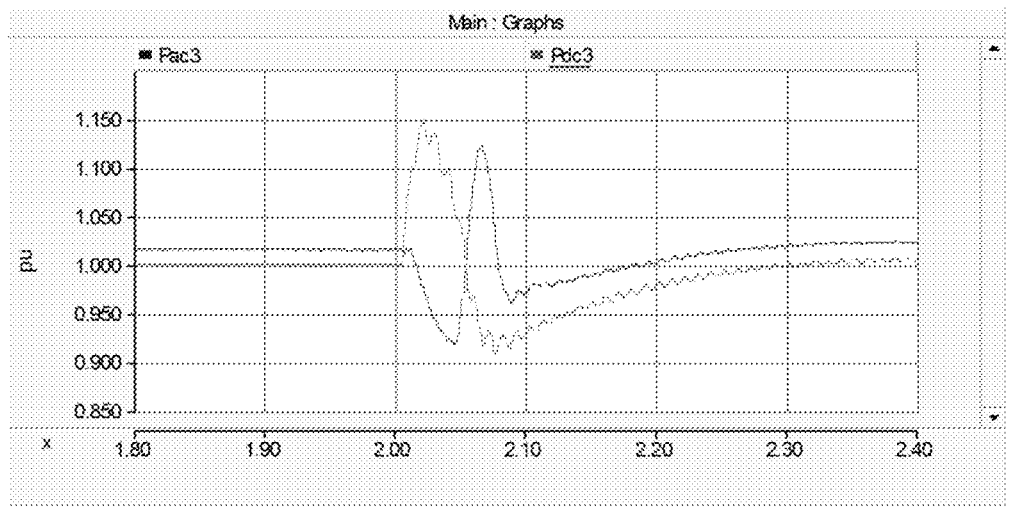
Figure 6B:
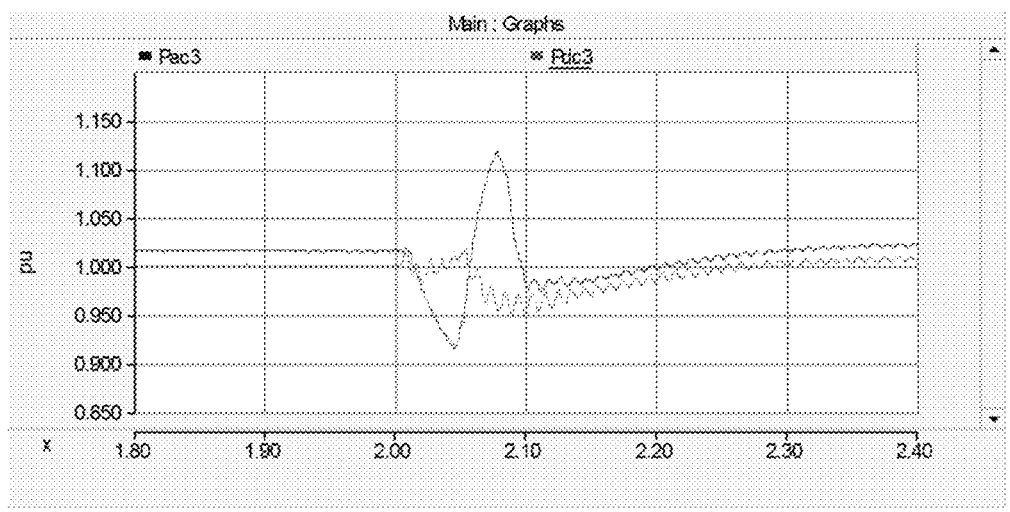
Figure 7A:
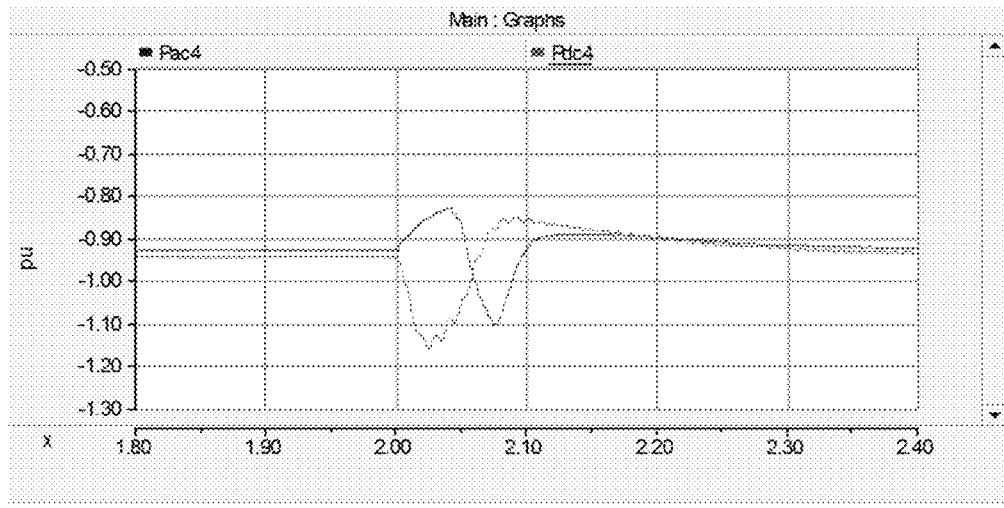
Figure 7B:
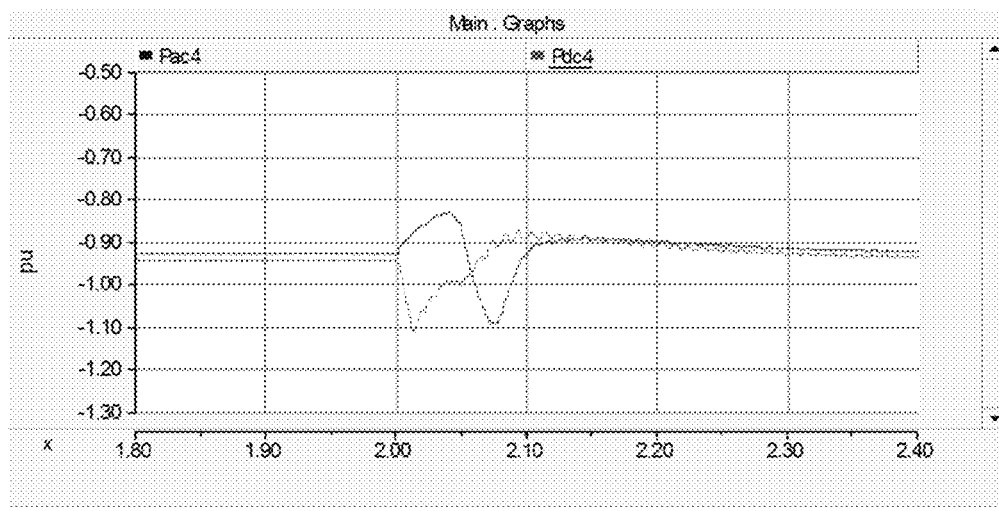

FIGS. 6A and 6B compares, in graphical form, the variations in AC and DC power for one of the second converters 34 connected to the healthy DC pole when (a) no changes are applied to the control of the second converters 34 connected to the healthy DC pole, as shown in FIG. 6A, and (b) the above-described method is applied, as shown in FIG. 6B. FIGS. 7A and 7B compares, in graphical form, the variations in AC and DC power for the other of the second converters 34 connected to the healthy DC pole when (a) no changes are applied to the control of the second converters 34 connected to the healthy DC pole, as shown in FIG. 7A, and (b) the above-described method is applied, as shown in FIG. 7B. It can be seen from FIGS. 6A, 6B, 7A and 7B that the application of the method results in a quicker recovery of the transmitted DC power in the healthy DC pole when compared to the method in which no changes are applied to the control of the second converters 34 connected to the healthy DC pole after the fault 64,164 occurs.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A bipolar DC power transmission scheme comprising:
   first and second DC poles, each DC pole including a respective DC power transmission medium extending between first and second ends;
   a plurality of converters, wherein each end of the DC power transmission medium of each of the first and second DC poles is respectively operatively connected to at least one of the plurality of converters to form a rectifier at the first ends of the DC power transmission media and an inverter at the second ends of the DC power transmission media; and
   a controller programmed to operate at least one converter of one of the rectifier and inverter in a first control mode and at least one converter of the other of the rectifier and inverter in a second control mode in response to a fault occurring on either of the first and second DC poles so as to oppose a resultant change in current in the healthy other of the first and second DC poles on which the fault has not occurred;
   wherein the first control mode includes decreasing the operating DC voltage of the or each corresponding converter from a normal operating voltage value, and wherein the second control mode includes increasing the operating DC voltage of the or each corresponding converter from a normal operating voltage value.

2. The bipolar power transmission scheme according to claim 1 wherein the first control mode includes decreasing the operating DC voltage of the or each corresponding converter from a normal operating voltage value to a minimum allowable voltage value and/or the second control mode includes increasing the operating DC voltage of the or each corresponding converter from a normal operating voltage value to a maximum allowable voltage value.

3. The bipolar DC power transmission scheme according to claim 2 wherein the maximum allowable voltage value is 1.0 per unit and/or the minimum allowable voltage value is limited by the peak magnitude of an AC side voltage of the corresponding converter.

4. The bipolar DC power transmission scheme according to claim 1 wherein the controller is programmed to operate the at least one converter of the rectifier in the first control mode and the at least one converter of the inverter in the second control mode in response to a converter current of at least one of the converters exceeding a first overcurrent threshold.

5. The bipolar DC power transmission scheme according to claim 4 further including a plurality of circuit interruption devices, each circuit interruption device arranged to be selectively operable to clear a respective one of the DC power transmission media, wherein the controller is programmed to block each converter with a converter current that exceeds a second overcurrent threshold and to send an open command to the or each corresponding circuit interruption device to clear the DC power transmission medium corresponding to the faulty one of the first and second DC poles on which the fault has occurred, wherein the second overcurrent threshold is higher than the first overcurrent threshold.

6. The bipolar DC power transmission scheme according to claim 1 further including a first monitoring device configured to identify the faulty one of the first and second DC poles on which the fault has occurred, wherein the at least one converter of the one of the rectifier and inverter operated in the first control mode and the at least one converter of the other of the rectifier and inverter operated in the second control mode is operatively connected to the healthy other of the first and second DC poles on which the fault has not occurred.

7. The bipolar DC power transmission scheme according to claim 6 further including a plurality of circuit interruption devices, each circuit interruption device arranged to be selectively operable to clear a respective one of the DC power transmission media, wherein the controller is programmed to block each converter connected to the identified faulty one of the first and second DC poles on which the fault has occurred and to send an open command to the or each corresponding circuit interruption device to clear the DC power transmission medium corresponding to the faulty one of the first and second DC poles on which the fault has occurred.

8. The bipolar DC power transmission scheme according to claim 6 wherein the monitoring device is configured to identify the faulty one of the first and second DC poles on which the fault has occurred by one or more of:
wherein the bipolar DC power transmission scheme includes a current return path, monitoring the direction of current in the current return path;
monitoring the reflection of one or more travelling waves in each DC power transmission medium;
monitoring the rate of rise of converter current of at least one of the plurality of converters;
monitoring the magnitude of converter current of at least one of the plurality of converters.

9. The bipolar DC power transmission scheme according to claim 1 wherein the controller is programmed to operate each converter operated in the respective one of the first and second control modes and connected to the healthy one of the first and second DC poles on which the fault has not occurred so as to operate in a third control mode subsequent to its operation in the respective one of the first and second control modes, the third control mode including restoring the operating DC voltage of the or each corresponding converter to a normal operating voltage value.

10. The bipolar DC power transmission scheme according to claim 9 wherein the controller is programmed to operate each converter operated in the respective one of the first and second control modes and connected to the healthy one of the first and second DC poles on which the fault has not occurred so as to operate in the third control mode when one or more of the following conditions are met:
decrease of the converter current in each corresponding converter below a third overcurrent threshold;
lapse of a time delay after the operation of each corresponding converter in the respective one of the first and second control modes;
lapse of a time delay after the decrease of the converter current in each corresponding converter below a fourth overcurrent threshold.

11. The bipolar DC power transmission scheme according to claim 9, wherein the controller is programmed to operate the at least one converter of the inverter in the first control mode and the at least one converter of the rectifier in the second control mode in response to a converter current of at least one of the converters connected to the healthy one of the first and second DC poles on which the fault has not occurred dropping below an undercurrent threshold and programmed to operate each converter operated in the respective one of the first and second control modes and connected to the healthy one of the first and second DC poles on which the fault has not occurred so as to operate in the third control mode when the converter current in each corresponding converter returns to a normal operating current value.

12. The bipolar DC power transmission scheme according to claim 1 wherein the controller is programmed to operate the at least one converter of the inverter in the first control mode and the at least one converter of the rectifier in the second control mode in response to a converter current of at least one of the converters connected to the healthy one of the first and second DC poles on which the fault has not occurred dropping below an undercurrent threshold.

13. The bipolar DC power transmission scheme according to claim 12 further including a second monitoring device configured to detect the occurrence of the fault in either of the first and second DC poles, wherein the controller is programmed to operate the at least one converter of the inverter in the first control mode and the at least one converter of the rectifier in the second control mode in response to the detection of the occurrence of the fault in either of the first and second DC poles.

14. The bipolar DC power transmission scheme according to claim 1 wherein the fault is a pole-to-ground fault.

15. The bipolar DC power transmission scheme according to claim 1 wherein at least one of the plurality of converters includes at least one module, the or each module including at least one switching element and at least one energy storage device, the or each switching element and the or each energy storage device in the or each module arranged to be combinable to selectively provide a voltage source, and optionally wherein the or each module includes a pair of switching elements connected in parallel with an energy storage device in a half-bridge arrangement to define a 2-quadrant unipolar module that can provide zero or positive voltages and can conduct current in two directions.

16. A method of operating a bipolar DC power transmission scheme, the bipolar DC power transmission scheme including first and second DC poles, each DC pole including a respective DC power transmission medium extending between first and second ends, the bipolar power transmission scheme further including a plurality of converters, wherein each end of the DC power transmission medium of each of the first and second DC poles is respectively operatively connected to at least one of the plurality of converters to form a rectifier at the first ends of the DC power transmission media and an inverter at the second ends of the DC power transmission media, the method comprising the steps of:
operating at least one converter of the rectifier in a first control mode and operating at least one converter of the inverter in a second control mode in response to a fault occurring on either of the first and second DC poles so as to oppose a resultant change in current in the healthy other of the first and second DC poles on which the fault has not occurred,
wherein the first control mode includes decreasing the operating DC voltage of the or each corresponding converter from a normal operating voltage value and wherein the second control mode includes increasing the operating DC voltage of the or each corresponding converter from a normal operating voltage value.

* * * * *